United States Patent [19]

Hayashi et al.

[11] Patent Number: 5,585,304

[45] Date of Patent: Dec. 17, 1996

[54] METHOD OF MAKING SEMICONDUCTOR DEVICE WITH MULTIPLE TRANSPARENT LAYERS

[75] Inventors: Yutaka Hayashi, Tsukuba; Kunihiro Takahashi, Tokyo; Hiroaki Takasu, Tokyo; Yoshikazu Kojima, Tokyo; Hitoshi Niwa, Tokyo; Nobuyoshi Matsuyama, Tokyo; Yomoyuki Yoshino, Tokyo; Masaaki Kamiya, Tokyo, all of Japan

[73] Assignees: Agency Industrial Science; Seiko Instruments Inc., both of Japan

[21] Appl. No.: 293,415

[22] Filed: Aug. 2, 1994

Related U.S. Application Data

[62] Division of Ser. No. 895,785, Jun. 9, 1992, abandoned.

[30] Foreign Application Priority Data

Jun. 13, 1991 [JP] Japan ................................. 3-142104

[51] Int. Cl.⁶ ............................................. H01L 21/302
[52] U.S. Cl. ........................ 437/62; 437/24; 437/239; 437/242; 437/974; 148/DIG. 12; 148/DIG. 135; 148/DIG. 148; 156/630.1
[58] Field of Search .............................. 437/24, 62, 239, 437/242, 974, 970; 148/DIG. 12, DIG. 135, DIG. 148; 156/630.1

[56] References Cited

U.S. PATENT DOCUMENTS

| | | | |
|---|---|---|---|
| 4,504,540 | 3/1985 | Kaminaka et al. | 428/195 |
| 4,601,779 | 7/1986 | Aberathey et al. | 437/24 |
| 4,697,330 | 10/1987 | Paterson et al. | 437/42 |
| 4,727,047 | 2/1988 | Bozler et al. | 437/89 |
| 4,983,538 | 1/1991 | Gotou | 148/DIG. 148 |
| 5,054,683 | 10/1991 | Hoisumo et al. | 437/974 |
| 5,059,543 | 10/1991 | Wise et al. | 437/3 |
| 5,206,749 | 4/1993 | Zavracky et al. | 257/347 |

FOREIGN PATENT DOCUMENTS

| | | | |
|---|---|---|---|
| 59-211749 | 12/1982 | Japan . | |
| 58-200524 | 11/1983 | Japan . | |
| 59-197129 | 11/1984 | Japan . | |
| 197129 | 11/1984 | Japan . | |
| 63-122265 | 5/1988 | Japan . | |
| 12543 | 1/1989 | Japan | 148/DIG. 12 |
| 1199457 | 8/1989 | Japan | 148/DIG. 135 |
| 130817 | 5/1990 | Japan . | |
| 5226307 | 1/1993 | Japan | 148/DIG. 12 |

OTHER PUBLICATIONS

S. Wolf, "Silicon Processing for the VLSIE", vol. 1, Process Technology, Lattice Press (1986), pp. 192, 210.
S. Wolf, "Silicon Processing for the VLSI Era", vol. 2, Process Integration, Lattice Press (1991), p. 70.

*Primary Examiner*—John Niebling
*Assistant Examiner*—Thomas G. Bilodeou
*Attorney, Agent, or Firm*—Adams & Wilks

[57] ABSTRACT

A semiconductor wafer is comprised of a transparent layer interposed between a thin silicon layer and a thick silicon layer. Silicon islands are formed from the thin silicon layer on the transparent layer. Device elements are formed in the silicon islands. Thereafter, the thick silicon layer which is a support layer is etched away to form a transparent region on the wafer. The wafer is constructed to avoid elimination or destruction of the transparent layer during the course of formation of the silicon islands and during the course of etching of the rear thick silicon plate. The transparent layer is comprised of a silicon nitride film or a silicon carbide film. Alternatively, the transparent layer is comprised of a silicon oxide film covered by a silicon nitride film or a silicon carbide film on one or both of the upper and lower faces of the silicon oxide film.

21 Claims, 6 Drawing Sheets

METHOD OF MAKING SEMICONDUCTOR DEVICE WITH MULTIPLE TRANSPARENT LAYERS

This is a division of application Ser. No. 07/895,785 filed Jun. 9, 1992, now abandoned.

BACKGROUND OF THE INVENTION

The present invention relates to a light transmissive semiconductor substrate. FIGS. 2(a)–2(d) show a conventional method of forming a Semiconductor-On-Insulator substrate (hereinafter, referred to as "SOI" substrate), utilizing a laminating method of a pair of single crystal silicon plates.

In the FIG. 2(a) step, a single crystal silicon plate 21 is thermally oxidized to form thereon a silicon oxide film 22 ($SiO_2$). In the FIG. 2(b) step, there is prepared another single crystal silicon plates 23. In the FIG. 2(c) step, the pair of silicon plate 21 and 23 are laminated with each other through the silicon oxide film 22 under a high temperature condition. In the FIG. 2(d) step, the silicon plate 21 formed with the silicon oxide film 22 is thinned to below several microns thickness by polishing or etching. The thus obtained SOI substrate of the conventional structure has a single layer of silicon oxide film interposed between a thick layer of single crystal silicon and a thin layer of single crystal silicon.

FIGS. 3(a)–3(d) show an etching process of the conventional SOI substrate or SOI wafer. In the FIG. 3(a) step, there is prepared a multi-layered structure of a thick silicon plate 33, a silicon oxide film 32 and a thin silicon film 31 in which a device element such as a transistor is to be formed and over which a resist film 34 is coated. In the FIG. 3(b) step, the resist film 34 is selectively removed by exposure and development treatment to form windows. In the FIG. 3(c) step, the silicon film 31 is dry-etched through the windows. The thin silicon film 31 has a variation in thickness over the wafer. In order to completely etch away the silicon film 31 from the respective windows, the silicon oxide film 32 is undercut entirely or partly during the course of the etching process, depending on the local thickness of the overlaying silicon film 31, thereby occasionally forming a deep trench. In the FIG. 3(d) step, the resist film 34 is removed to expose silicon islands 36 bordered by trenches 35. In the case where the depth of the trench is rather large, there are caused various drawbacks in later steps of exposure and development, such as that a focusing adjustment is difficult on the top of the silicon island 36 and the bottom of the deep trench 35 due to a gap therebetween to thereby prevent formation of a precise pattern. Further, in the case where the silicon oxide film 32 is utilized functionally in view of its optically transparent nature, the at least partial removal of the silicon oxide film during the etching process would cause serious defects.

FIGS. 4(a)–4(b) show an example of the specific technology in which a patterned single crystal silicon film is transferred to a transparent substrate by adhesion, and to which one aspect of the present invention is associated. In the FIG. 4(a) step, there is prepared an SOI substrate composed of single crystal silicon islands 41 which are several hundred Å to several times ten μm thick formed with a device element such as a transistor, an underlying silicon oxide film 42 and a single crystal silicon plate 43. These layers 41, 42 and 43 are laminated together in the form of the conventional SOI wafer. A transparent substrate 45 composed of quartz or glass is fixed to the SOI wafer through a transparent adhesive 44. Thereafter, the opaque and thick silicon plate 43 is etched away. After finishing the etching process, the silicon plate 43 is lost such that the silicon islands 41 are transferred to the transparent substrate 45 so that an optically transparent region 46 is formed around the opaque islands 41. That is, light can be transmitted through the transparent regions 46 formed between the silicon islands 41. This type of quartz substrate is utilized to constitute a light valve element in which an optically active material such as a liquid crystal is applied to the transparent region 46.

As an example of a practical construction, the rear silicon plate 43 has a thickness on the order of 500–600 μm, and the silicon oxide film 42 has a thickness in the range of 0.2–1.0 μm. Therefore, as shown in FIG. 4(b), the silicon oxide film 42 may not function efficiently as an etching stopper during the course of etching the rear silicon plate 43, so that the silicon oxide film 42 may be eliminated entirely from the substrate surface. Further, in the progression of the etching process, the rear silicon plate 43 is variably etched due to local differences in an etching rate over the plate material, thereby disadvantageously exposing spots of the silicon oxide film 42 before completely removing the silicon plate 43. At this time, the exposed spot of the silicon oxide film may be broken by stress applied from a surrounding portion of the silicon plate.

When attempting to build a substrate for an optical switching device shown in FIGS. 4(a)–4(b) using a substrate for an integrated circuit shown in FIG. 2(d) via the steps shown in FIGS. 3(a)–3(d), the insulating silicon oxide film of the SOI wafer may be disadvantageously over-etched when etching the thin silicon film 31 (FIG. 3(b)) to form the silicon islands 36 (FIG. 3(c)) on which a device element such as a transistor is to be formed in FIG. 3. Further, as noted in conjunction with FIGS. 4(a) and 4(b), the insulating silicon oxide film of the SOI wafer may be entirely or partly eliminated or may be broken disadvantageously when etching the thick silicon plate 43 or silicon support.

SUMMARY OF THE INVENTION

An object of the present invention is to preserve a silicon oxide film or a transparent film during the course of etching a thin silicon film to form silicon islands or during the course of etching a thick rear silicon plate. In order to achieve the object, according to the present invention, an insulating film or a transparent film of the SOI wafer is comprised of a single layer of a silicon nitride film or a silicon carbide film which has a tensile stress, or comprised of a multi-layer silicon oxide film laminated with a silicon nitride film or a silicon carbide film on both of the upper and lower faces or on only one face of the silicon oxide film. In the inventive semiconductor device, the optically transparent film of the SOI wafer can be preserved as it is without damage after etching the front thin silicon film so as to form silicon islands formed for a device element such as a transistor, and further even after subsequently etching the rear thick silicon plate.

DETAILED DESCRIPTION OF THE INVENTION

FIGS. 1(a)–1(d) show a method of producing the inventive semiconductor device, utilizing a laminating method of a pair of single crystal silicon plates or supports. In the FIG. 1(a) step, a single crystal silicon plate 11 is thermally nitrogenized or is deposited with a silicon nitride to form a silicon nitride film 12 (hereinafter, referred to as "SiNx" film). Alternatively, a silicon carbide is desposited to form a silicon carbide film 12. Thereafter, the film 12 is thermally oxidized or an $SiO_2$ is deposited to form a silicon oxide film 13. Further, a film 14 composed of an SiNx or a silicon carbide is deposited on the silicon oxide film.

Figure 1A:
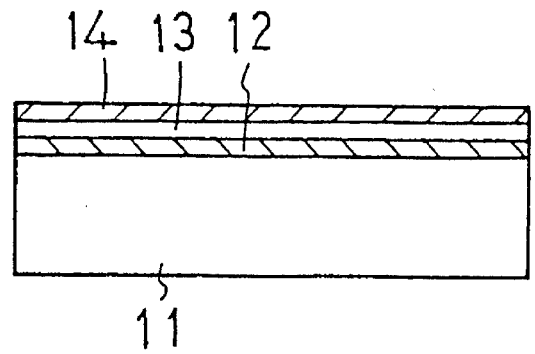
FIGS. 1(a)–1(d) are a process step diagram showing one embodiment of the invention.
Figure 1B:
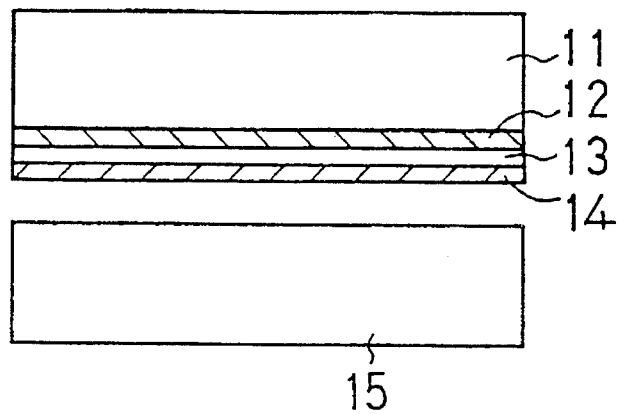
Figure 1C:
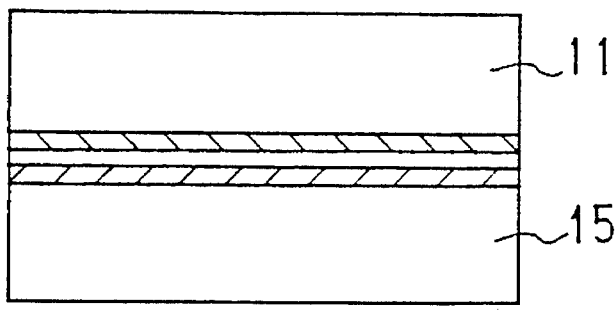
Figure 1D:
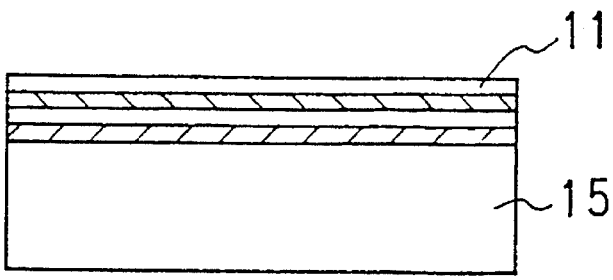
Figure 2A:
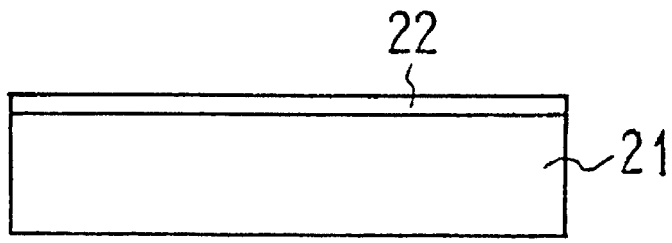
FIGS. 2(a)–2(d) are a process step diagram showing the conventional method of making an SOI substrate.
Figure 2B:
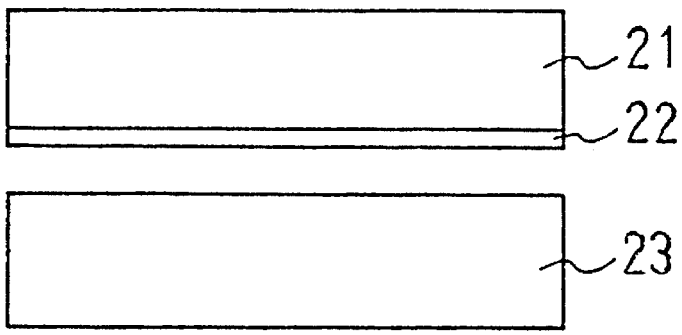
Figure 2C:
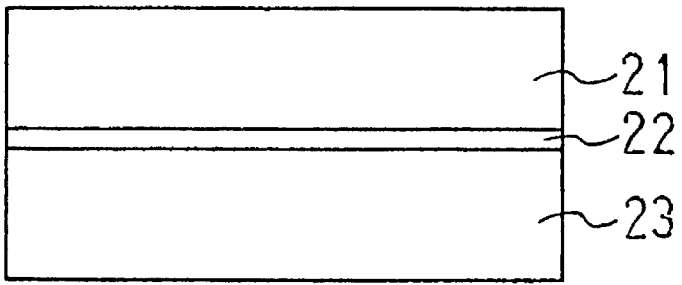
Figure 2D:
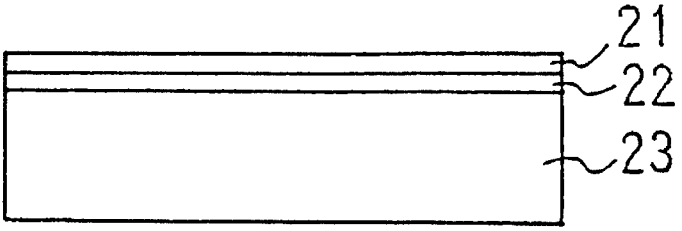
Figure 3A:
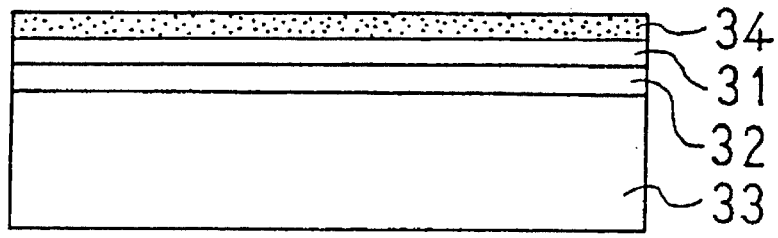
FIGS. 3(a)–3(d) are a process step diagram showing the conventional method of etching an SOI substrate.
Figure 3B:
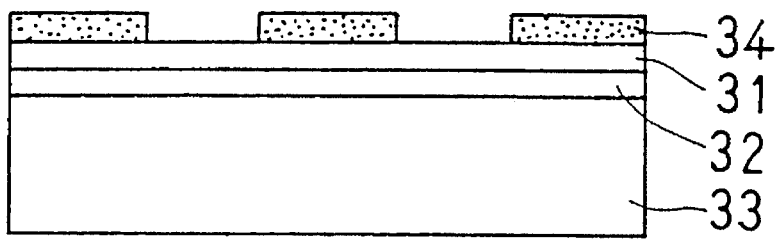
Figure 3C:
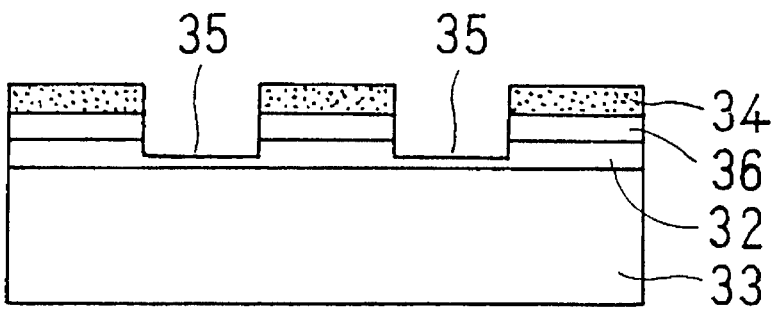
Figure 3D:
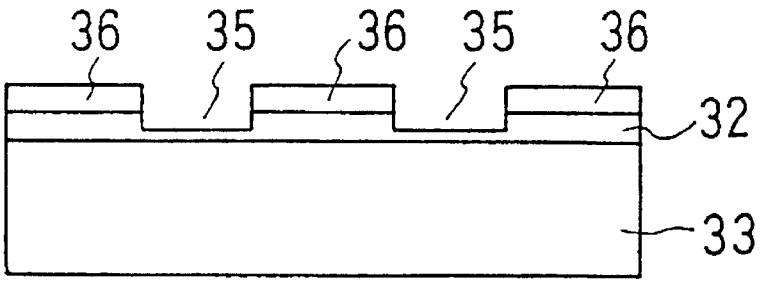
Figure 4A:
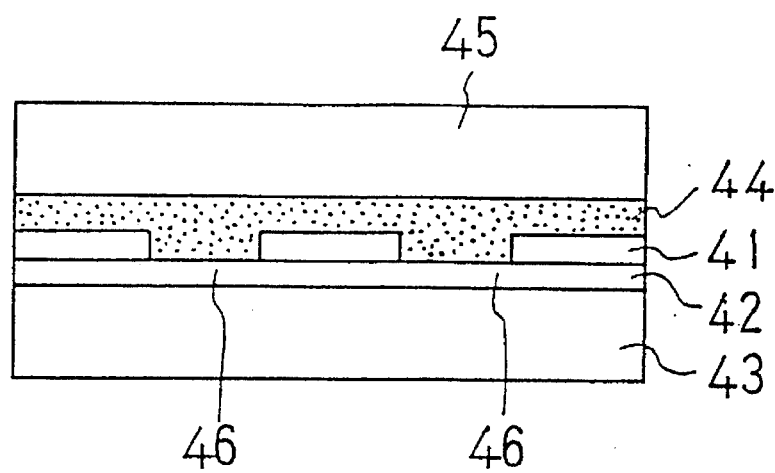
FIGS. 4(a) and 4(b) are a process step diagram showing one embodiment of a method of etching an SOI substrate.
Figure 4B:
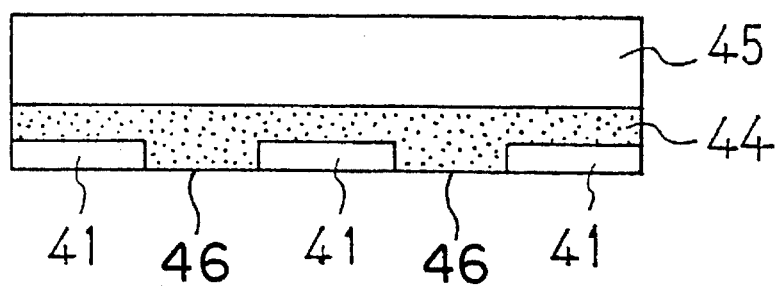

In the FIG. 1(b) step, there is prepared another single crystal silicon plate 15. Then, in the FIG. 1(c) step, the silicon plate 15 is laminated on the other silicon plate 11 through an intermediated layer composed of the silicon oxide and the silicon nitride or silicon carbide, under a high temperature condition. Lastly, the single crystal silicon plate 11 is thinned by polishing or etching to below a thickness of several μm in the FIG. 1(d) step.

Figure 5:
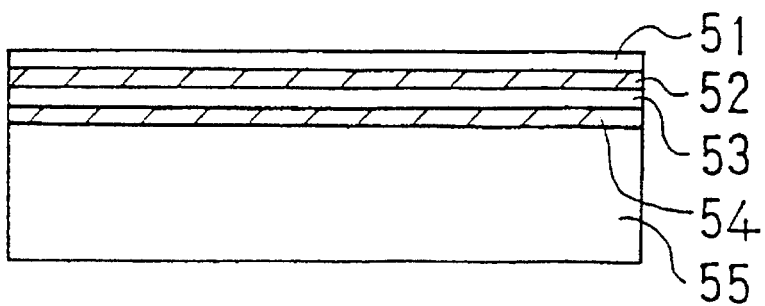
FIG. 5 is a structural section showing one embodiment of the invention.

FIG. 5 is a sectional and structural view of the thus formed inventive semiconductor device. An $SiO_2$ film 53 is interposed between a thin single crystal silicon film 51 which is used for a semiconductor layer and a thick single crystal silicon plate 55 which is used for a semiconductor substrate. The transparent $SiO_2$ film 53 is sandwiched by laminating films 52 and 54 composed of an SiNx or a silicon carbide. Though not shown in the drawings, the inventive structure of the semiconductor device includes various modifications. For example one of the laminating films 52, 54 composed of the SiNx or silicon carbide may be eliminated, or another transparent film may be disposed on either of the upper and lower laminating films 52, 54 composed of SiNx or silicon carbide.

The inventive semiconductor device having the FIG. 5 structure can be formed by other methods than the method of laminating a pair of single crystal silicon wafers or plates. For example, an ion implantation method is utilized to successively dope adequate amounts of nitrogen or carbon, oxygen, and again nitrogen or carbon at adequate acceleration energies into a surface of a single crystal silicon wafer to directly form the inventive semiconductor device of the FIG. 5 structure. In this case, the acceleration energy of the ion implantation is set differently in forming the upper and lower films 52, 54 of SiNx or silicon carbide such that the acceleration energy is set higher when forming the lower film 54.

Figure 6A:
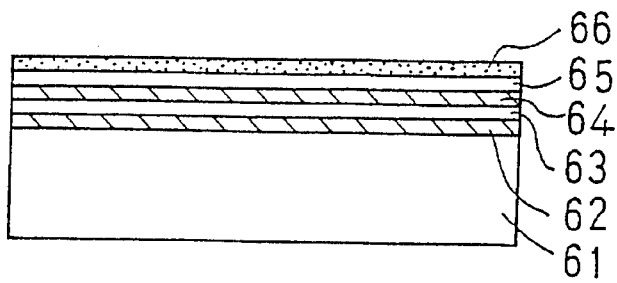
FIGS. 6(a)–6(f) are a process step diagram showing another embodiment of the invention.
Figure 6B:
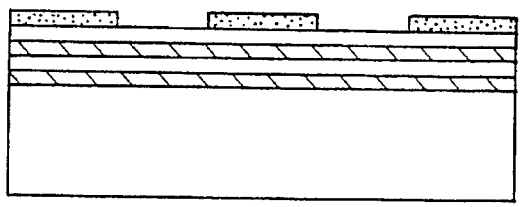
Figure 6C:
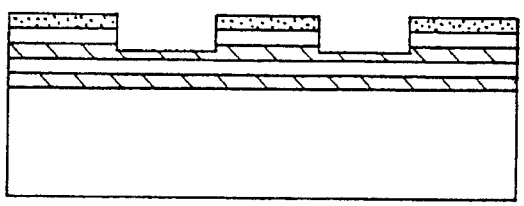

FIGS. 6(a)–6(f) show another embodiment of the invention. In the FIG. 6(a) step, there is prepared an SOI substrate comprised of a thick single crystal silicon support 61, a pair of lower and upper SiNx films 62, 64, a silicon oxide film 63 sandwiched by the SiNx films 62 and 64, a thin single crystal silicon film 65 in which is to be formed a device element such as a transistor, and a resist film 66 coated on the silicon film 65. In the FIG. 6(b) step, the resist film 66 is selectively removed by an exposure and development process to form windows to expose a part of the thin single crystal silicon film 65. In the FIG. 6(c) step, the silicon film 65 is removed by dry etching through the windows. The silicon film 65 has a variable thickness throughout the wafer. Therefore, after etching the silicon film completely over the wafer, the upper silicon nitride film 64 is also etched partly as shown in FIG. 6(c). However, the underlying silicon oxide film 63 is protected by the upper film 64, and therefore can keep its original thickness without being etched.

Figure 6D:
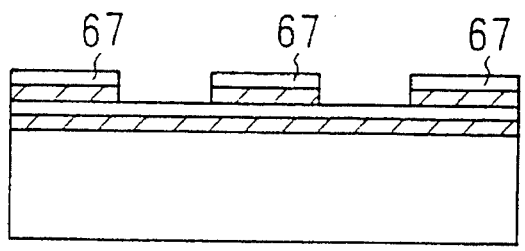

Next, in the FIG. 6(d) step, if necessary, the wafer is dipped into a hot phosphoric acid solution to remove the remaining portion of the upper SiNx film 64. As mentioned above, during the etching process of the FIG. 6(c) step, the silicon oxide film 63 is protected by the overlaying silicon nitride film 64, hence the silicon oxide film 63 is kept free from the etching effect. The resist film is also removed to expose silicon islands 67. Thereafter, a device element such as a transistor is formed on each island. By this construction, optically transparent regions 46 are formed allowing light to be transmitted through the optically transparent regions formed between the silicon islands 67.

Figure 6E:
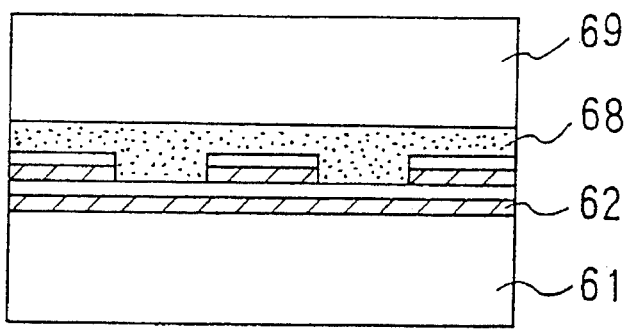
Figure 6F:
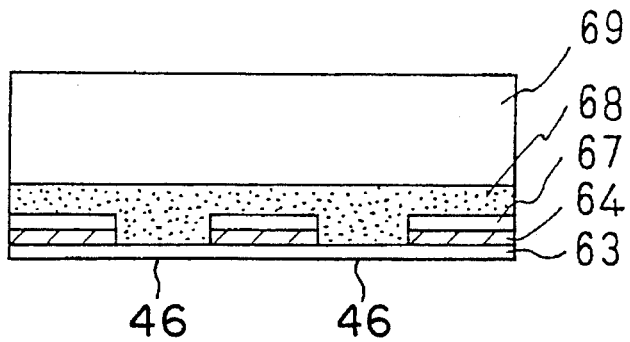

Then, in the FIG. 6(e) step, a quartz substrate 69 is fixed to the wafer by an adhesive 68. Lastly in the FIG. 6(f) step, the thick silicon plate 61 of the rear side is completely etched away. Since the rear thick silicon plate 61 has a variable thickness throughout the wafer, the lower SiNx film 62 may be locally etched concurrently by an etchant at an area where the silicon plate 61 has a relatively small thickness. The SiNx film 62 can be safely preserved throughout the wafer surface by suitably setting the thickness of the SiNx film 62 or by selecting an organic alkali such as a hydrazine as an etchant agent. Thereafter, if necessary, the remaining SiNx film 62 is completely removed by etching using a hot phosphoric acid solution to thereby obtain the FIG. 6(f) structure. Consequently, the silicon oxide film 63 can be preserved as it is during the course of the etching process of the rear silicon plate 61. Accordingly, the device element such as a transistor formed in the silicon island 67 is protected by the presence of the silicon oxide film 63 and additionally by the SiNx film 63 to the extent it remains.

Figure 7:
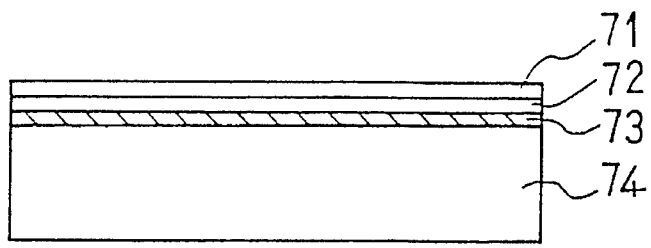
FIG. 7 is a structural section showing an embodiment of the invention.

FIG. 7 shows a sectional structure of another embodiment of the inventive semiconductor device. The device is comprised of a single crystal silicon film 71 in which device elements such as a transistor is formed, a silicon oxide film 72, an SiNx film 73 and a single crystal silicon support 74. In this laminated structure, the silicon nitride film 73 is disposed under the silicon oxide film 72 such that the silicon oxide film 72 is held free from overetching which would otherwise occur when the silicon support 74 is subjected to an etching process.

The silicon nitride film 73 functions as an etching stopper. Further, the silicon nitride film 73 can function as reinforcement since it has a tensile stress. All of the rear silicon in the thickness direction is partially etched away at some portions of the substrate during etching of the single crystal silicon plate 74 since the thickness or etching rate of the single crystal silicon plate 74 is not uniform. At this time, in the conventional substrate which exists without the silicon nitride film 73, the silicon oxide film 72 easily breaks at the portions where the rear silicon does not exist, due to a compressive stress of the silicon oxide film 72. However, in the present invention, the silicon oxide film 72 and the silicon nitride film 73 do not break since the silicon nitride film 73 provides a tensile stress between the single crystal silicon plate 74 and the silicon oxide film 72.

Figure 8:
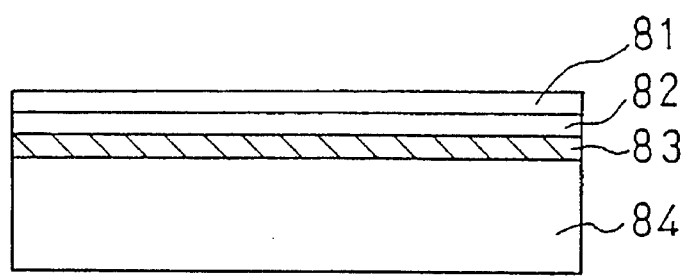
FIG. 8 is a structural section showing another embodiment of the invention.

FIG. 8 shows a sectional structure of a modification of the FIG. 7 embodiment. In this structure, a single crystal silicon film 81 and a single crystal silicon plate 84 correspond to the film 71 and plate 74 of the FIG. 7 embodiment. In addition, a silicon carbide film 83 is disposed under a silicon oxide film 82 to protect the same. The silicon carbide also has a tensile stress.

Figure 9:
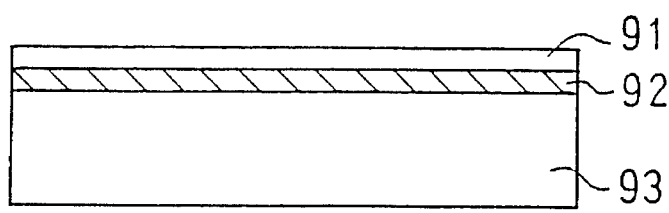
FIG. 9 is a structural section showing a further embodiment of the invention.

FIG. 9 shows a sectional structure of a further embodiment of the inventive semiconductor device. A transparent film 92 disposed below a single crystal silicon film 91 is composed of a single layer of a silicon nitride or a silicon carbide in place of a silicon oxide. The silicon nitride film and the silicon carbide film can function as an etching stopper during the etching process of a rear silicon support 93. Further, the silicon nitride film and the silicon carbide film have a tensile stress such that these films are not broken during etching of the rear silicon plate.

Figure 10:
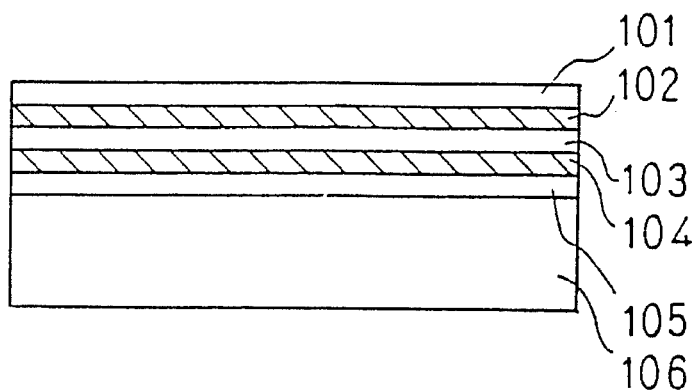
FIG. 10 is a structural section showing a still further embodiment of the invention.

FIG. 10 shows a sectional structure of a still further embodiment of the inventive semiconductor device. The device is comprised of a single crystal silicon film 101 in which is to be formed a device element such as a transistor, a pair of upper and lower protective films 102, 104 composed of a silicon nitride or a silicon carbide, a silicon oxide film 103 sandwiched by the pair of protective films 102, 104, another silicon oxide film 105 disposed under the lower protective film 104, and a single crystal silicon support 106.

The FIG. 10 embodiment is different from the FIG. 5 embodiment in that the additional silicon oxide film 105 is disposed on the support 106. This silicon oxide film 105 is interposed to improve adhesion capacity when laminating a pair of silicon plates through an intermediate transparent layer. The silicon oxide film has better adhesion ability to the silicon plate than the silicon nitride film or the silicon carbide film. The present invention includes such a type of semiconductor device in which one or both of the transparent film faces is covered by an additional silicon oxide film.

As described above in detail, the inventive semiconductor device is constructed such that the intermediate transparent layer is composed of a silicon nitride film or a silicon carbide film, or the intermediate transparent layer is composed of a silicon oxide film coated by a silicon nitride film or a silicon carbide film on one or both of the upper and lower faces of the silicon oxide film. By such construction, the silicon oxide film is held completely free from overetching when forming a silicon island by etching a thin silicon film disposed on the transparent layer, and even when removing a rear thick silicon plate by etching. Further, the transparent layer is not broken during the course of etching. Moreover, the gap can be reduced between the top of the silicon island and the bottom of a trenched insulating film, thereby advantageously contributing to forming a precise pattern by an exposure and development process. In addition, a silicon oxide film, silicon nitride film or silicon carbide film is preserved on the bottom of the silicon island to thereby protect a device element formed on the silicon island from external contamination.

What is claimed is:

1. A method of producing a semiconductor substrate, comprising the steps:

(a) providing a first single crystal silicon plate;

(b) forming a first multi-layer transparent film on a surface of the first silicon plate by forming a first transparent film of one of silicon nitride and silicon carbide on the surface of the first silicon plate, forming a second transparent film of silicon oxide over the first transparent film and forming a third transparent film of one of silicon nitride and silicon carbide over the second transparent film;

(c) providing a second single crystal silicon plate;

(d) laminating the second silicon plate on the first silicon plate through the first multi-layer transparent film; and (e) reducing the thickness of one of the first and second silicon plates to a value suitable for forming electronic elements in the silicon plate of reduced thickness.

2. The method of producing a semiconductor substrate according to claim 1; wherein the step of forming the first transparent film comprises thermally nitriding the first silicon plate to form a silicon nitride film.

3. The method of producing a semiconductor substrate according to claim 1; wherein step (e) comprises polishing or etching the silicon plate to the reduced thickness.

4. The method of producing a semiconductor substrate according to claim 1; wherein the step of forming the silicon oxide film on the first transparent film comprises thermally oxidizing the first transparent film.

5. The method of producing a semiconductor substrate according to claim 1; wherein the step of forming the silicon oxide film on the first transparent film comprises depositing silicon oxide on the surface of the first transparent film.

6. The method of producing a semiconductor substrate according to claim 1; further including a step of forming a multi-layer film on the silicon plate of reduced thickness.

7. The method of producing a semiconductor substrate according to claim 6; further including a step of removing the other of the first and second silicon plates.

8. The method of producing a semiconductor substrate according to claim 1; further including a step of forming a silicon oxide film between the first single crystal silicon plate and the first transparent film.

9. The method for fabricating a semiconductor device, comprising the steps of:

forming a multi-layer transparent film on a first single crystal silicon layer by forming a first transparent film having a tensile stress on the first single crystal silicon layer, forming a second transparent film having a compressive stress on the first transparent film and forming a third transparent film having a tensile stress on the second transparent film;

fixing a second single crystal silicon layer on the multi-layer transparent film; and removing part of the first single crystal silicon layer.

10. The method for fabricating a semiconductor device according to claim 9; wherein the first transparent film comprises at least one of silicon nitride and silicon carbide.

11. The method for fabricating a semiconductor device according to claim 9; wherein the step of forming the first transparent film comprises doping one of the elements chosen from the group consisting of nitrogen and carbon into the first single crystal silicon layer to a predetermined depth, and heating the doped first single crystal silicon layer.

12. The method for fabricating a semiconductor device according to claim 9; wherein the step of forming the first and second transparent films comprises doping nitrogen and oxygen into the first single crystal silicon layer each to a predetermined depth, and heating the doped first single crystal silicon layer to form the first and second transparent films comprising a silicon nitride layer and a silicon oxide layer, respectively.

13. The method for fabricating a semiconductor device according to claim 9; wherein the step of forming the first and second transparent films comprises doping carbon and oxygen into the first single crystal silicon layer each to a predetermined depth, and heating the doped first single crystal silicon layer to form the first and second transparent films comprising a silicon carbide layer and a silicon oxide layer, respectively.

14. The method for fabricating a semiconductor device according to claim 9; including etching the first single crystal silicon layer using the multi-layer transparent film as an etch stop.

15. The method for fabricating a semiconductor device according to claim 9; including etching the second single crystal silicon layer using the multi-layer transparent film as an etch stop.

16. The method of fabricating a semiconductor device according to claim 9; wherein the third film comprises at least one of silicon nitride and silicon carbide.

17. The method of producing a semiconductor substrate, comprising the steps: providing a first single crystal silicon plate; forming a first transparent film having a tensile stress on a surface of the first single crystal silicon plate; forming a second transparent film having a compressive stress on the first transparent film; forming a third transparent film having a tensile stress on the second transparent film; providing a second single crystal silicon plate; laminating the second single crystal silicon plate on the first single crystal silicon plate through the first, second and third transparent films; and reducing the thickness of one of the first and second single crystal silicon plates to a value suitable for forming electronic elements in the single crystal silicon plate of reduced thickness.

18. The method of producing a semiconductor substrate as claimed in claim 17; wherein the step of forming the first and third transparent films comprises forming one of a silicon nitride film and a silicon carbide film.

19. The method of producing a semiconductor substrate as claimed in claim 17; wherein the step of forming the second transparent film comprises forming a silicon oxide film.

20. The method of producing a semiconductor substrate as claimed in claim 19; wherein the step of forming the silicon oxide film on the first transparent film comprises thermally oxidizing the first transparent film.

21. The method of producing a semiconductor substrate as claimed in claim 17; wherein the reducing step comprises polishing or etching the silicon plate to the reduced thickness.

* * * * *